United States Patent [19]

Owen et al.

[11] 4,109,028

[45] Aug. 22, 1978

[54] FABRICATION OF CATHODES FOR ELECTRODEPOSITION

[75] Inventors: Edwin Lewis Owen, Concord; David William Marshall, North Reading, both of Mass.

[73] Assignee: Kennecott Copper Corporation, New York, N.Y.

[21] Appl. No.: 804,996

[22] Filed: Jun. 9, 1977

Related U.S. Application Data

[63] Continuation-in-part of Ser. No. 716,838, Aug. 23, 1976, abandoned.

[51] Int. Cl.² ................................................ C25D 1/04
[52] U.S. Cl. ........................................ 427/58; 96/36.4; 101/128.3; 101/129; 148/6.2; 204/11; 204/12; 204/13; 204/281; 427/259; 427/282; 427/287; 427/327; 427/386; 427/410
[58] Field of Search .................... 204/11, 12, 13, 281; 427/58, 282, 287, 327, 386, 410, 259; 96/36.4; 101/128.3, 129; 148/6.2

[56] References Cited

U.S. PATENT DOCUMENTS

| | | | |
|---|---|---|---|
| 2,860,576 | 11/1958 | Short | 101/128.3 |
| 3,226,255 | 12/1965 | Cieniewicz et al. | 427/282 |
| 3,425,831 | 2/1969 | Poole | 101/128.3 |
| 3,507,654 | 4/1970 | Wrench | 101/128.3 |
| 3,642,530 | 2/1972 | Webb | 427/410 |
| 3,755,018 | 8/1973 | Miller | 148/6.2 |
| 3,907,609 | 9/1975 | Coggins | 148/6.2 |
| 3,929,610 | 12/1975 | Wang | 204/13 |
| 3,932,198 | 1/1976 | Schneider | 148/6.2 |

*Primary Examiner*—John D. Smith
*Attorney, Agent, or Firm*—John L. Sniado; Anthony M. Lorusso

[57] ABSTRACT

Disclosed is a method of preparing a cathode for use in the electrodeposition of metallic structures in a predetermined pattern. A porous planar member is provided with a masked region of its porous surface corresponding to the desired pattern of the metallic filaments. A mating planar surface of a cathode base is cleaned, preferably leaving a tightly adhering intermediate coating on the planar surface, and then a non-conductive material, preferably an epoxy based resin ink, is forced through the porous planar member and printed onto the planar surface of the cathode base. The masked region of the porous member will prevent the printing in a region corresponding to the desired pattern on the cathode surface.

14 Claims, 3 Drawing Figures

FABRICATION OF CATHODES FOR ELECTRODEPOSITION

REFERENCE TO RELATED APPLICATION

This application is a continuation-in-part of our co-pending application, Ser. No. 716,838 filed Aug. 23, 1976, now abandoned.

BACKGROUND OF THE INVENTION

This invention relates to cathodes for use in the electroforming of metallic structures.

Electrodeposition techniques have, of course, been known for some time. Typically, a cathode is provided having an exposed conductive surface of a suitable shape to cause deposition of metal in a predetermined pattern. Although various techniques for producing such cathodes have been proposed, for many types of products (e.g., fine metallic filaments used to form wire conductors) difficulties in the electrodeposition techniques generally and in cathodes in particular, have prevented the wide-scale commercial acceptance of electrodeposition. A commercially acceptable cathode should be relatively inexpensive to manufacture, should have a relatively long useful lifetime, and should permit the stripping of the, typically delicate, deposited metallic structures from cathode surface. Of the various previous cathode fabrication techniques, some have permitted relatively inexpensive manufacture of cathodes but have resulted in a cathode that was difficult to use and did not have a long lifetime. Other cathode structures have had a longer lifetime that was gained by a design requiring relatively expensive manufacturing techniques.

The following references are cited as illustrative of previously proposed cathode designs. Emerson U.S. Pat. No. 395,773, Sanders U.S. Pat. No. 541,986, and Sanders U.S. Pat. No. 625,205 each teach, essentially, the use of a metal filament wound around a rotary cylindrical member with adjacent convolutions of the filament separated by an insulating material, the filament defining the surface for deposition of metal. In Forsyth et al U.S. Pat. No. 570,125, an insulating rubber strip is set into a spiral groove formed into a passive metal base, spaced between adjacent rubber convolutions forming the plating surface. A number of patents have taught various permutations of photoresist/etch techniques for producing either cathode patterns or circuits inlaid into a backing material. Exemplary of these techniques are: George U.S. Pat. No. 3,368,945; Knisley U.S. Pat. No. 3,582,476; Backwell U.S. Pat. No. 3,703,450; and Jacobus U.S. Pat. No. 3,833,482. Klemm U.S. Pat. No. 3,891,514 forms a cathode by filling depressions in a base with a conductor and then grinding flat the adjacent conductor and base surfaces, a relatively expensive technique. Finally, various cathode fabrication techniques were taught in Wang U.S. Pat. No. 3,929,610, issued Dec. 30, 1975, owned by the assignee of the present application, and incorporated herein by reference; as well as in references cited in the file history of that patent. The Wang patent dealt with a particular cathode design problem to which the present application is also directed. That is, the fabrication of a cathode suitable for electroforming very fine metallic filaments of indefinite length. While the cathode designs of the Wang patent were relatively successful in meeting the desired cathode criteria even in this particularly difficult electrodeposition problem, according to the present invention it has been discovered that other fabrication techniques that are potentially less expensive also yield good results.

In view of the foregoing discussion, it is a principal object of the present invention to provide a method of cathode fabrication which is relatively inexpensive and which yields a cathode of relatively high quality. It is a more particular object of the present invention to provide a method of cathode fabrication in which the expensive items of the method can be used over and over.

SUMMARY OF THE INVENTION

The invention features a method of preparing a cathode for use in the electroforming of thin metallic filaments in a predetermined pattern comprising the steps of (a) partially masking a porous planar member to provide a masked region corresponding to the desired predetermined pattern; (b) providing an electrically conductive cathode base having a planar surface; (c) cleaning that planar surface; (d) overlying the cleaned planar surface with the porous planar member and (e) printing non-conductive material through the porous member and onto the planar surface; whereby the predetermined pattern is formed on the planar cathode surface surrounded by the nonconductive material printed onto that surface.

In preferred embodiments of the invention, the cleaning step features leaving a tightly adherent coating, for example, a conversion layer such as an oxidation of a passivation layer coating, on the planar surface and the printing step features using a non-conductive epoxy based resin ink.

BRIEF DESCRIPTION OF THE DRAWINGS

Other objects, features, and advantages of the invention will appear from the following description of particular preferred embodiments as explained in conjunction with the accompanying illustrative drawings.

In the drawings.

DETAILED DESCRIPTION OF PARTICULAR PREFERRED EMBODIMENTS AND TECHNIQUES

Figure 1:
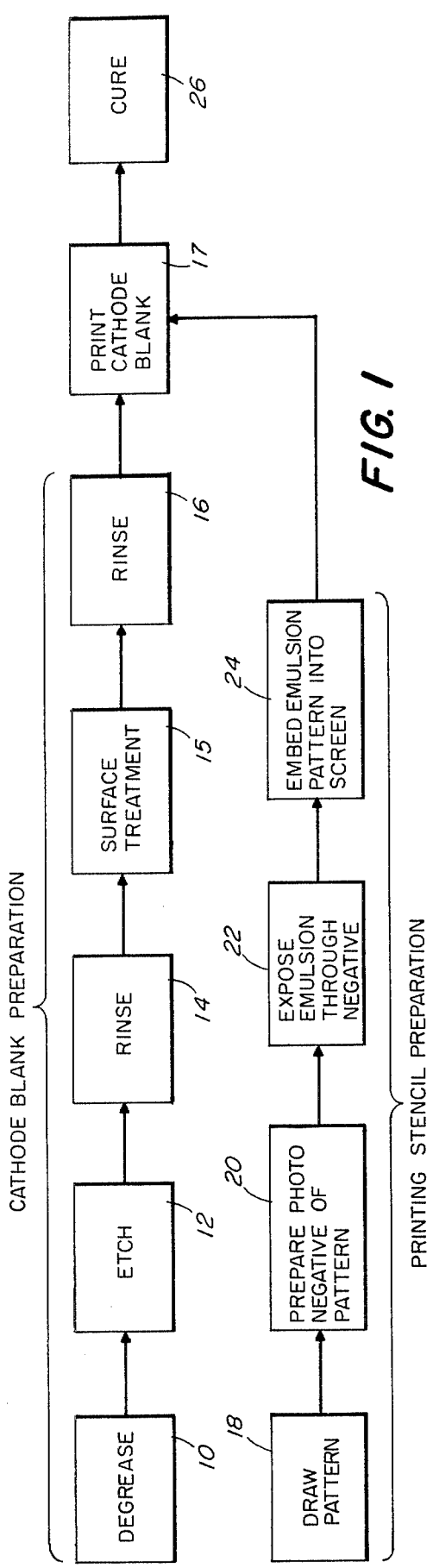
FIG. 1 is a flow diagram illustrating the sequence of steps of cathode manufacture in accordance with the present invention.

Referring to FIG. 1, a cathode blank in the form of a metal plate (not shown) is prepared by the step 10 of degreasing, the step 12 of etching, the step 14 of rinsing, the step 15 of surface treating, and the step 16 of rinsing. A printing operation, indicated at 17, produces the desired plating surface pattern on the cathode. This printing operation is achieved using a printing stencil that is prepared in accordance with steps 18-24.

In the particular preferred embodiments of the invention, after the degreasing, etching, rinsing and surface treatment steps, which steps together describe an overall cleaning or preparation of the cathode blank, the cathode blank is left with a thin tightly adhering intermediate coating. It is the presence of this coating which, at least for stainless steel and titanium, provides the highest quality cathode. Apparently, at least for stainless steel and titanium, the tightly adherent layer provides the mechanism by which the printing ink will firmly attach to the blank surface. Other types of cleaning or cathode preparation, depending on the starting material, may of course be used, but in each instance it is important, according to the preferred embodiment of the invention, to leave a tightly adhering layer (if necessary) on the cathode blank which will enable the later applied printing ink to better adhere to the blank.

In step 18 the desired pattern of the metallic structures to be formed is drawn on any photographically reproducible medium (e.g., black ink on white paper). Naturally, depending upon the particular pattern desired, various aids may be useful in drawing the pattern. (In cases where the pattern is extremely intricate and/or extreme precision is required, computer assisted drawing may even be desirable). The drawn pattern is then photographed and a photgraphic negative produced in conventional fashion as at step 20. This negative is employed, in step 22, to expose a photographic emulsion that is preferably mounted on a plastic backing. Development of the emulsion will permit the washing away of unexposed portions of the emulsion leaving only the exposed emulsion on the plastic backing. In step 24, this exposed emulsion portion is embedded into a porous member (e.g., a fine mesh screen) and the plastic backing is then stripped away. This screen is then employed in the actual printing of the cathode blank with a non-conductive printing fluid being forced through the screen to print all portions of the cathode blank except those corresponding to the emulsion pattern embedded in the screen. Often the non-conductive printing fluid is of the type that can have its hardness, and/or its degree of bonding to the underlying cathode, or tightly adherent intermediate layer, improved through a final curing step 26. A particularly preferred family of printing inks which have unexpectedly proven exceptionally adherent to the cathode blank are the commercial available epoxy based resin inks. These inks are, for example, manufactured by the Hysol Division of the Dexter Corp.

In the printing step 16, the fine mesh screen in firmly retained closely adjacent the surface of the cathode blank to be printed. The process described, therefore, is best suited for use with cathodes having a planar surface to be printed and in which the porous screen is itself also planar. A peripheral rigid frame around the edges of the actual screen can facilitate the clamping of the screen to the base to assure correct spacing therebetween and to prevent relative movement between the two members during the printing operation.

EXAMPLE 1

A one foot square stainless steel plate 28 was employed as a cathode blank and was first degreased with trichloroethane, than etched for 30 minutes in a solution of 25% $HNO_3$ plus $Na_2Cr_2O_7$, and then rinsed with water. The blank was then placed in a 5% solution of $Na_2Cr_2O_7$ for an additional 30 minutes at 65° to passivate the surface, thus leaving a tightly adhering intermediate pasivation layer or coating on the surface of the blank. A final water rinse and drying readied the blank for actual printing.

Figure 2:
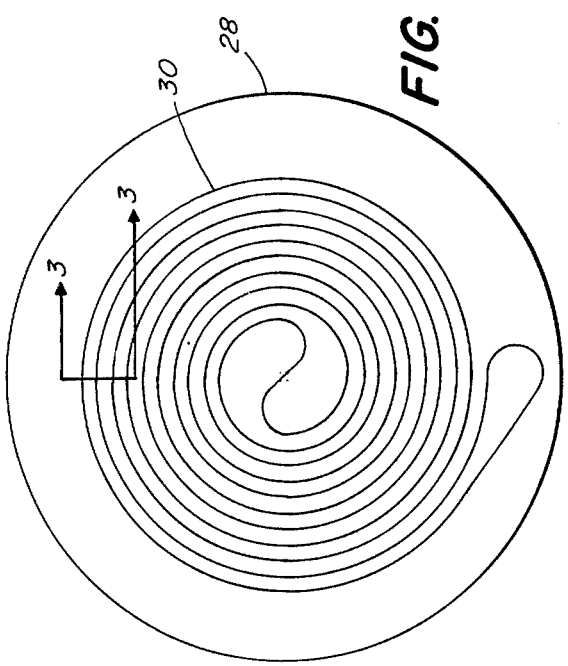
FIG. 2 is a plan view of a cathode prepared in accordance with the method of FIG. 1.

A printing stencil was prepared by drawing in black ink on white paper a double spiral closed-loop pattern, such as is illustrated at 30 in FIG. 2 and as is described in detail in the above-mentioned Wang U.S. Pat. No., 3,929,610. The pattern was drawn to a size larger than that desired for transferral to the one foot cathode plate and the pattern was reduced in size in the photographic steps to be described, in order to minimize any imperfections in the drawing (e.g., imperfections caused by ink absorption onto the paper). The drawing was photographed and a negative produced. A photographic emulsion on a plastic backing was exposed to the negative, developed, and the unexposed portion of the emulsion washed away. The exposed portion, which remained on the plastic backing, had softened during processing and was pressed into a silk screen. The plastic backing was removed and the screen was inserted into a rigid frame.

The screen frame was then clamped to the prepared cathode blank with the screen spaced from the adjacent blank surface by a distance of between approximately $\frac{1}{4}$ inch and $\frac{3}{8}$ inch. An epoxy based resin that is commercially available under the designation of WORNOW-50-771 (manufactured by the Hysol Division of Dexter Corp.) was applied as a printing fluid to a peripheral section of the screen that had been completely blocked out so that ink could be contained on that part of the screen prior to actual printing. A squeegee was used to force resin through the screen by pulling the squeegee across the face of the screen in contact therewith. After removal of the screen, the cathode blank was completely coated with non-conductive epoxy based resin 32 (see FIG. 3) except for the desired pattern. The epoxy based resin adhered satisfactorily to the passivated surface of the stainless steel plate. The coated plate was air dried over night, then cured for one hour at 250° F. Alternately, the curing step could be for 20 minutes at 300° F, for 7 minutes at 350° F, or for 3 minutes at 400° F. The cathode was then ready for use in a continuous metallic filament electroforming operation such as described in Wang U.S. Pat. No. 3,929,610.

EXAMPLE 2

A cathode blank similar to that described above, but formed from titanium, was degreased with acetone, then dried and etched in a solution comprising 15% by volume of a 70% $HNO_3$ solution, 3% by volume of a 50% HF solution, and 82% by volume of water. The etch time was chosen to be between 15 seconds and 45 seconds. After etching, the titanium plate was rinsed in tap water and then immersed for 2 minutes in a solution comprising the following materials per liter of solution; 50 grams of trisodium phosphate, 20 grams of potassium fluoride, and 26 milliliters of a 50% solution of hydrofluoric acid. This was followed by another water rinse and air drying. This left a firmly adhering oxide layer or coating on the surface of the blank. The blank thus prepared was printed employing a printing stencil and a printing fluid as described above in Example 1.

Figure 3:
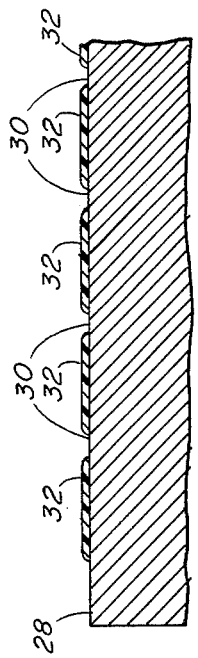
FIG. 3 is a greatly enlarged view taken at 3—3 of FIG. 2.

Because, as best seen in FIG. 3, the final cathode has a pattern produced simply by a non-conductive fluid bonded to a conductive surface of the cathode in a pattern that is the converse of the desired deposition pattern, it is a very simple matter to recycle cathodes. After a period of usage of the cathode, the printing material 28 is removed from the cathode surface and a new cathode is prepared using steps 10, 12, 14, 15, 16, 17, 26 of FIG. 1. Although recycling of various elements of cathode structures in previous cathode designs was possible, the present arrangement permits a virtually indefinite lifetime for the cathode blanks.

While particular preferred embodiments and techniques of the present invention have been illustrated in the accompanying drawings and described in detail herein, other embodiments are within the scope of the invention and the following claims.

What is claimed is:

1. The method of preparing a cathode for use in the electroforming of thin metallic filaments in a predetermined pattern comprising the steps of
   (a) partially masking a porous planar member to provide a masked region corresponding to said predetermined pattern;
   (b) providing an electrically conductive metal cathode base having a planar surface;
   (c) cleaning said planar surface;
   (d) overlying the cleaned planar surface with said porous planar member;
   (e) printing a non-conductive material through said porous member and onto said planar surface;
   whereby said predetermined pattern is formed on said planar surface intermediate said non-conductive material printed onto said planar surface.

2. The method of claim 1 wherein said step (c) comprises the sub-steps of degreasing, etching, surface treating, and rinsing, and
   wherein said no-conductive material is bonded to said planar surface.

3. The method of claim 1 wherein said cleaning step leaves a tightly adherent layer on the surface of said metal cathode base.

4. The method of claim 3 wherein said adherent layer is a conversion layer.

5. The method of claim 4 wherein said adherent layer is a passivation layer.

6. The method of claim 4 wherein said base is formed from stainless steel.

7. The method of claim 6 wherein said stainless steel is degreased with trichloroethane and is etched with a HNO₃ solution.

8. The method of claim 4 wherein said adherent layer is an oxidation layer.

9. The method of claim 4 wherein said base is formed from titanium.

10. The method of claim 9 wherein said titanium is degreased with acetone and is etched with a HNO₃ solution.

11. The method of claim 1 wherein said step (a) comprises providing a photographic emulsion on a plastic backing, exposing said photographic emulsion through a negative bearing said predetermined pattern, removing the unexposed portion of said emulsion, pressing said exposed portion of said emulsion into a fine mesh screen, and removing said plastic backing.

12. The method of claim 1 wherein said step (e) comprises printing an epoxy based resin through said porous member and onto said planar surface.

13. The method of claim 12 wherein said step (e) further comprises curing the epoxy based resin printed onto said planar surface.

14. The method of preparing a cathode for use in the electroforming of thin metallic filaments in a predetermined pattern comprising the steps of
   (a) partially masking a porous planar member to provide a masked region corresponding to said predetermined pattern;
   (b) providing an electrically conductive metal cathode base having a planar surface;
   (c) cleaning the planar surface to leave a tightly adherent layer on the surface of said metal cathode base;
   (d) overlying the cleaned planar surface with said porous planar member;
   (e) printing an epoxy based resin through said porous member and onto said planar surface;
   whereby said predetermined pattern is formed on said planar surface intermediate said non-conductive material printed onto said planar surface.

* * * * *